United States Patent
Morigami

[11] Patent Number: 5,970,017
[45] Date of Patent: Oct. 19, 1999

[54] DECODE CIRCUIT FOR USE IN SEMICONDUCTOR MEMORY DEVICE

[75] Inventor: Seiichi Morigami, Tokyo, Japan

[73] Assignee: NEC Corporation, Tokyo, Japan

[21] Appl. No.: 08/932,178

[22] Filed: Sep. 17, 1997

[30] Foreign Application Priority Data

Sep. 20, 1996 [JP] Japan ................................ 8-250146

[51] Int. Cl.⁶ .................................................. G11C 8/00
[52] U.S. Cl. .......................... 365/230.06; 365/230.03; 365/230.08
[58] Field of Search ................ 365/230.06, 230.03, 365/203, 230.01, 189.11, 230.08

[56] References Cited

U.S. PATENT DOCUMENTS

| | | | |
|---|---|---|---|
| 5,402,386 | 3/1995 | Tavrow et al. | 365/230.06 |
| 5,414,663 | 5/1995 | Komarek et al. | 365/189.05 |
| 5,625,598 | 4/1997 | Oba | 365/203 |
| 5,631,871 | 5/1997 | Park et al. | 365/200 |

FOREIGN PATENT DOCUMENTS

| | | |
|---|---|---|
| 1-279491 | 11/1989 | Japan . |
| 5-266669 | 10/1993 | Japan . |

*Primary Examiner*—David Nelms
*Assistant Examiner*—David Lam
*Attorney, Agent, or Firm*—Foley & Lardner

[57] ABSTRACT

A decode circuit for use in a semiconductor memory device can prevent an increase of an area of X-decoder and can possess a plurality of banks with operating speed maintained. A word line selection signal makes a word line of a first bank region high level, before it makes first bank selection measure "off" to separate word line selection measure from the first bank region. Next, it makes second bank selection measure "on" to use the word line selection measure for selecting the word line of the second bank region so that one word line selection measure is used in common in terms of both the first bank region and the second bank region.

8 Claims, 6 Drawing Sheets

DECODE CIRCUIT FOR USE IN SEMICONDUCTOR MEMORY DEVICE

BACKGROUND OF THE INVENTION

The present invention relates to a decode circuit for use in a semiconductor memory device. More particularly, this invention relates to the decode circuit for use in the semiconductor memory device in which it causes the semiconductor memory device to operate with the semiconductor memory device divided into a plurality of banks.

DESCRIPTION OF THE PRIOR ART

FIG. 1 is a block diagram showing an array configuration of a semiconductor memory device of a conventional sub-word method.

In FIG. 1, reference numerals 31–34 denote memory cell array, reference numerals 35 and 36 denote respective X-decoders which select main word line 45, reference numerals 37, 40, 41, and 44 denote respective Y-decoders which select bit line, reference numerals 38, 39, 42, and 43 denote sub-decoders which select sub-word lines 46 and 48, reference numeral 45 denotes main word line, 46 and 48 denote sub-word line, 47 and 49 denote sub-word selection lines. Here, in the sub-word system, load is reduced at the time of selection for the word line according to the fact that a plurality of sub-word lines 46 and 48 are connected to the main word line 45.

In the above configuration, at the time of selection for the word line, one main word line 45 is selected by the X-decoders 35 and 36 in respective I/O interfaces 1–7, before the sub-word selection lines 47 and 49 are selected by the sub-decoders 38, 39, 42, and 43, thus required sub-word lines 46 and 48 are selected.

FIG. 2 is a view showing a word line selection method of the semiconductor memory device of sub-word method.

In FIG. 2, respective memory cell arrays 31 to 34 of FIG. 1 is divided into four units. For example, five sub-word decoders 50 to 54 are provided for the memory cell array 31 and eight sub-word lines 46 are connected to one main-word line 45.

Here, when the sub-word line 46 shown in FIG. 6 with dotted line to select, the main word line 45 is selected by the X-decoder 35 before the sub-word selection line 47 is selected by the sub-decoder 38. In this case, the sub-word decoders 50, 52, 54 are activated by the sub-word line selection signal outputted from the sub-decoder 38. When the sub-word line 46 denoted by chain line of FIG. 2 is selected, the sub-word decoders 51 and 53 are activated by the sub-word line selection signal outputted from the sub-decoder 38.

FIG. 3 is a circuit diagram showing configuration of X-decoders 35 and 36 of FIG. 1.

As shown in FIG. 3, P channel MOS transistor M21 whose source is connected to a power source VDD, and whose drain is connected to the main word line 45 is provided.

P channel MOS transistor M22 whose source is connected to the power source VDD, whose gate is connected to the main word line 45, and whose drain thereof is connected to a gate of the P channel MOS transistor M 21 is provided.

P channel MOS transistor M23 whose source is connected to the power source VDD, whose gate is connected to an input terminal of main word line reset signal PX2, and whose drain is connected to the drain of the P channel MOS transistor M22 is provided.

N channel MOS transistor M24 whose source is connected to ground voltage GND, whose gate is connected to the gate of the P channel MOS transistor M21, and whose drain is connected to the drain of the P channel MOS transistor M21 is provided.

N channel MOS transistor M25 whose gate is connected to an input terminal of a main word line selection signal X2N3N4N, and whose drain is connected to the drain of the P channel MOS transistor M23 is provided.

N channel MOS transistor M26 whose gate is connected to an input terminal of a main word line selection signal X5N6N7N, and whose drain is connected to the source of the N channel MOS transistor M25 is provided.

N channel MOS transistor M27 whose source is connected to ground voltage GND, whose gate is connected to an input terminal of a main word line selection signal X8N9N, and whose drain is connected to the source of the N channel MOS transistor M26 is provided.

In the above configuration, at the time of main word line selection, 2N3N4N, X5N6N7N, and X8N9N of the main word line selection signal come into "H" level. At this time, since the main word line reset signal PX2 is "H" level, the P channel MOS transistor M23 whose gate is connected to the input terminal of the main word line reset signal PX2 comes into non electrical continuity.

For this reason, the N channel MOS transistor M25 whose gate is connected to the input terminal of the main word line selection signal X2N3N4N comes into electrical continuity. The N channel MOS transistor M26 whose gate is connected to the input terminal of the main word line selection signal X5N6N7N comes into electrical continuity. And the N channel MOS transistor M27 whose gate is connected to the input terminal of the main word line selection signal X8N9N come into electrical continuity. Thus contacts N21 connected to the drain of the N channel MOS transistor M25 comes into "L" level.

As a result, the P channel MOS transistor M21 whose gate is connected to the contacts N21 comes into electrical continuity, while the N channel MOS transistor M24 whose gate is connected to the contacts N21 comes into non electrical continuity, thereby the main word line 45 comes into "H" level, thus selection of the main word line 45 is implemented.

In the time when the main word line is selected, the main word line selection signals X2N3N4N, X5N6N7N, and X8N9N are maintained "H" level until the main word line 45 is made non selected state.

Next, at the time when the main word line is not selected, the main word line selection signals X2N3N4N, X5N6N7N, and X8N9N come into "L" level. At this time, the main word line reset signal PX2 comes into "L" level, the P channel MOS transistor M23 whose gate is connected to the input terminal of the main word line reset signal PX2 comes into electrical continuity.

For this reason, the N channel MOS transistor M25 whose gate is connected to the input terminal of the main word line selection signal X2N3N4N comes into non electrical continuity. The N channel MOS transistor M26 whose gate is connected to the input terminal of the main word line selection signal X5N6N7N comes into non electrical continuity. The N channel MOS transistor M27 whose gate is connected to the input terminal of the main word line selection signal X8N9N comes into non electrical continuity. Thus the contacts N21 connected to the drain of the N channel MOS transistor M25 comes into "H" level.

As a result, the P channel MOS transistor M21 whose gate is connected to the contacts N21 comes into non electrical continuity, while the N channel MOS transistor M24 whose gate is connected to the contacts N21 comes into electrical continuity, thereby the main word line 45 comes into "L" level, thus the main word line 45 comes into non selected state.

Thus the conventional semiconductor memory device uses the main word line 45 selected by the X-decoders 35 and 36 in common, by selecting the sub-word lines 46 and 48 of the memory cell arrays 31 to 34 using the sub-decoders 38, 39, 42, and 43. The X-decoder 35 intervenes between the upper and lower sides memory cell arrays 31 and 33, and the X-decoder 36 intervenes between the upper and lower sides memory cell arrays 32 and 34 whereby these configuration constitutes common I/O interface. The semiconductor memory uses the X-decoders 35 and 36 which selects the main word line 45 and the upper and lower memory cell arrays 31 to 34 in common, thereby reducing the area of the X-decoder 35 and 36.

However, in the semiconductor memory having two banks A and B, when the bank A is constituted by the memory cell arrays 31 and 32, and the bank B is constituted by the memory cell arrays 33 and 34, since it is necessary to select the word line independently in respect to the bank A and the bank B, it is also necessary to provide the X-decoders 35 and 36 which select the main word line 45 independently in each upper and lower memory cell arrays 31 to 34. For this reason, it is necessary to provide the X-decoders 35 and 36 with twice as many of the semiconductor memory of FIG. 1, and the number of the control signal line of the X-decoders 35 and 36 becomes twice as many as thereof, with the result that there is a problem that the area of the X-decoder 35 and 36 increase.

In the meantime, when the bank A is constituted by the memory cell arrays 31 and 33 to change I/O interfaces 0 to 3 of the memory cell array 33 into I/O interfaces 4 to 7 thereof, and the bank B is constituted the memory cell arrays 32 and 34 to change I/O interfaces 4 to 7 of the memory cell array 32 into I/O interfaces 0 to 3 thereof, since the X-decoders 35 and 36 are capable of being used by the upper and lower memory cell arrays 31 to 34 in common, thus it is capable of avoiding increase of area of the X-decoders 35 and 36.

However, in this bank configuration, since the same I/O interfaces 1 to 7 between bank A and the bank B is necessary to be connected, I/O-bus lines should be wired about half of longitudinal direction of chip. There is the problem that chip area is increased and operating speed becomes slow because capacity of wiring and resistance of wiring are increased.

SUMMARY OF THE INVENTION

In view of the foregoing, it is an object of the present invention for achieving the above-mentioned problems to provide a decode circuit for use in a semiconductor memory device which is capable of avoiding increase of area of X-decoder and which is capable of providing a plurality of bank configuration while maintaining operating speed.

According to a first aspect of the present invention, for achieving the above-mentioned object, there is provided a decode circuit for use in a semiconductor memory device which comprises word line selection means for selecting a word line, latching means for latching a word line selection signal outputted from the word line selection means, and for maintaining the word line at high level, and reset means for releasing the word line from latch of the word line selection signal by the latching means, and for making the word line low level.

According to a second aspect of the present invention, there is provided a decode circuit for use in a semiconductor memory device in the first aspect. The latching means equips flip-flop. The word line selection signal is provided for a set terminal of the flip-flop, and a reset signal outputted from the reset means is provided for a reset terminal of the flip-flop, and an output terminal of the flip-flop is connected to the word line.

According to a third aspect of the present invention, there is provided a decode circuit for use in a semiconductor memory device wherein a decode circuit is provided between a first bank region and a second bank region which have a common input / output section. The decode circuit comprises word line selection means for selecting a word line, first bank selection means for selecting the first bank region, second bank selection means for selecting the second bank region, first latching means for latching a word line selection signal outputted from the word line selection means, and for maintaining the word line of the first bank region at high level based on a selection signal outputted from the first bank selection means, second latching means for latching a word line selection signal outputted from the word line selection means, and for maintaining a word line of the second bank region at high level based on a selection signal outputted from the second bank selection means, first reset means for releasing latch of the word line selection signal by the first latching means, and for making the word line of the first bank region low level, and second reset means for releasing the latch of the word line selection signal by the second latching means, for making the word line of the second bank region low level.

According to a fourth aspect of the present invention, there is provided a decode circuit for use in a semiconductor memory device in the above third aspect wherein the first latching means comprises a first flip-flop, and the second lathing means comprises a second flip-flop. In the first flip-flop, a selection signal outputted from the first bank selection means is applied to a set terminal of the first flip-flop, a reset signal outputted from the first reset means is applied to a reset terminal of the first flip-flop, and an output terminal of the first flip-flop is connected to the word line of the first bank region. In the second flip-flop, a selection signal outputted from the second bank selection means is applied to a set terminal of the second flip-flop, a reset signal outputted from the second reset means is applied to a reset terminal of the second flip-flop, and an output terminal of the second flip-flop is connected to the word line of the second bank region.

As stated above, the decode circuit for use in the semiconductor memory device according to the invention there is provided with the word line selection means and with the latching means, making the word line high level by the word line selection signal, before the word line is capable of being maintained at high level by the latching means, thus a load of the word line selection means is capable of being reduced.

Further, in the decode circuit for use in the semiconductor memory device which is provided between the first bank region and the second bank region having the input / output section in common, selection of the word line of the first bank region and selection of the word line of the second bank region are capable of being implemented by the common word line selection means. When the semiconductor memory device is of the two banks configuration, an increase of an area of the decode circuit is capable of being inhibited, and speed down caused by an increase of wiring length of the input / output bus line can be prevented.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENTS

As to a semiconductor memory device of a preferred embodiment of the invention will now be described in detail referring to the accompanying drawings.

Figure 1:
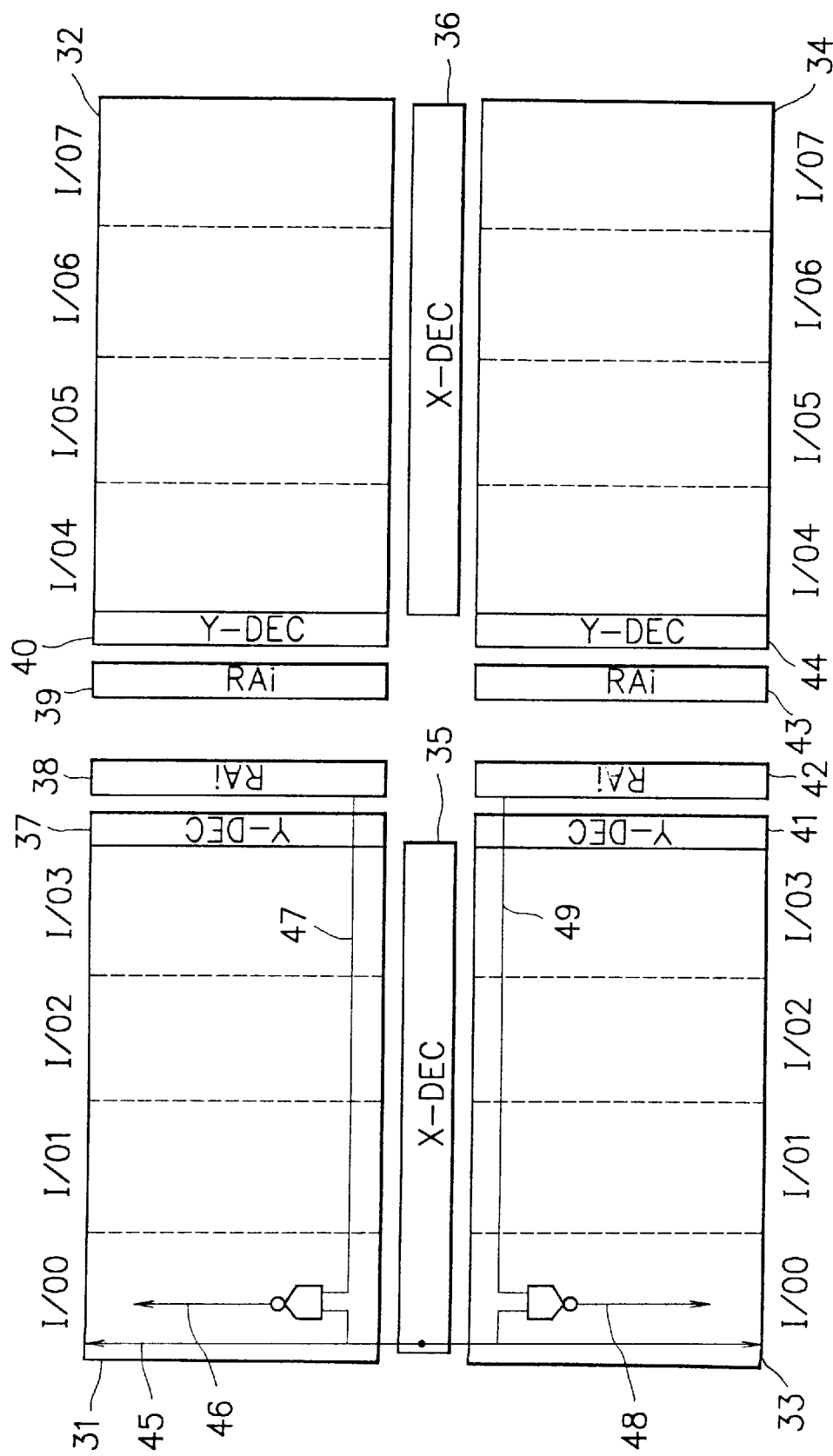
FIG. 1 is a block diagram showing an array configuration of the semiconductor memory device of the conventional sub-word method.
Figure 2:
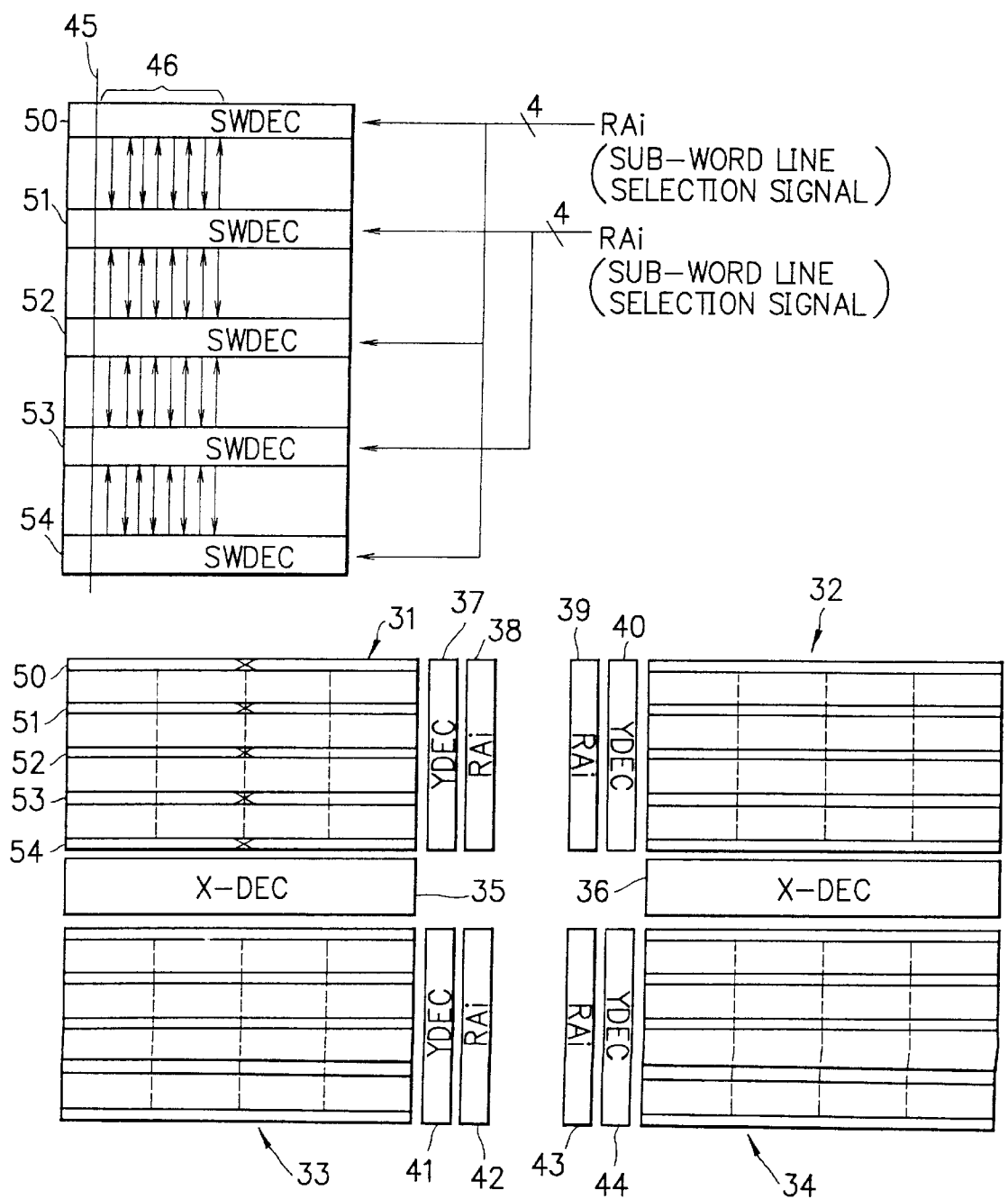
FIG. 2 is a view showing a word line selecting method of the conventional semiconductor memory device of the sub-word method.
Figure 3:
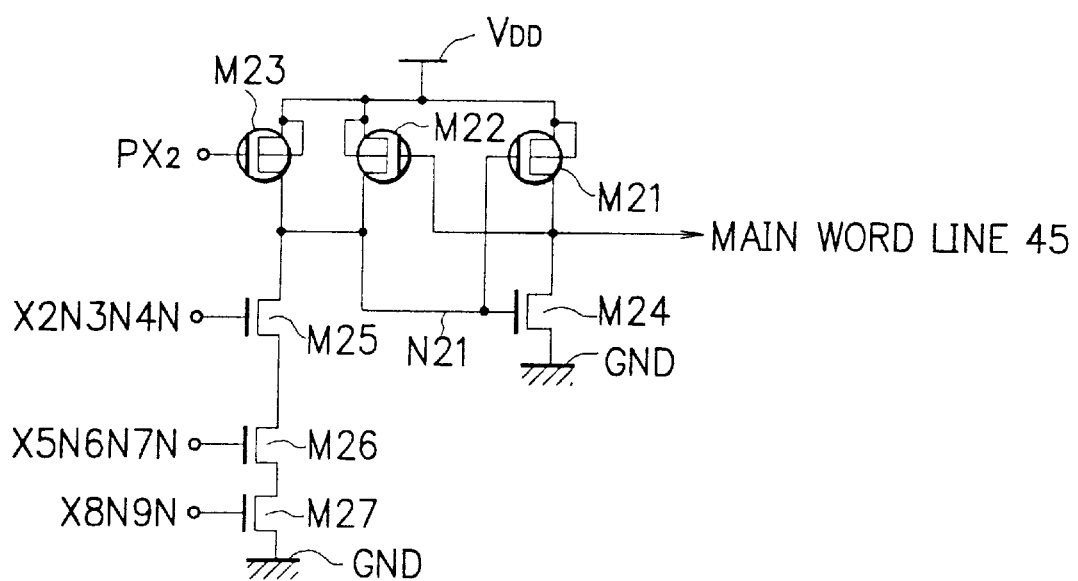
FIG. 3 is a circuit diagram showing a configuration of the conventional decode circuit.
Figure 4:
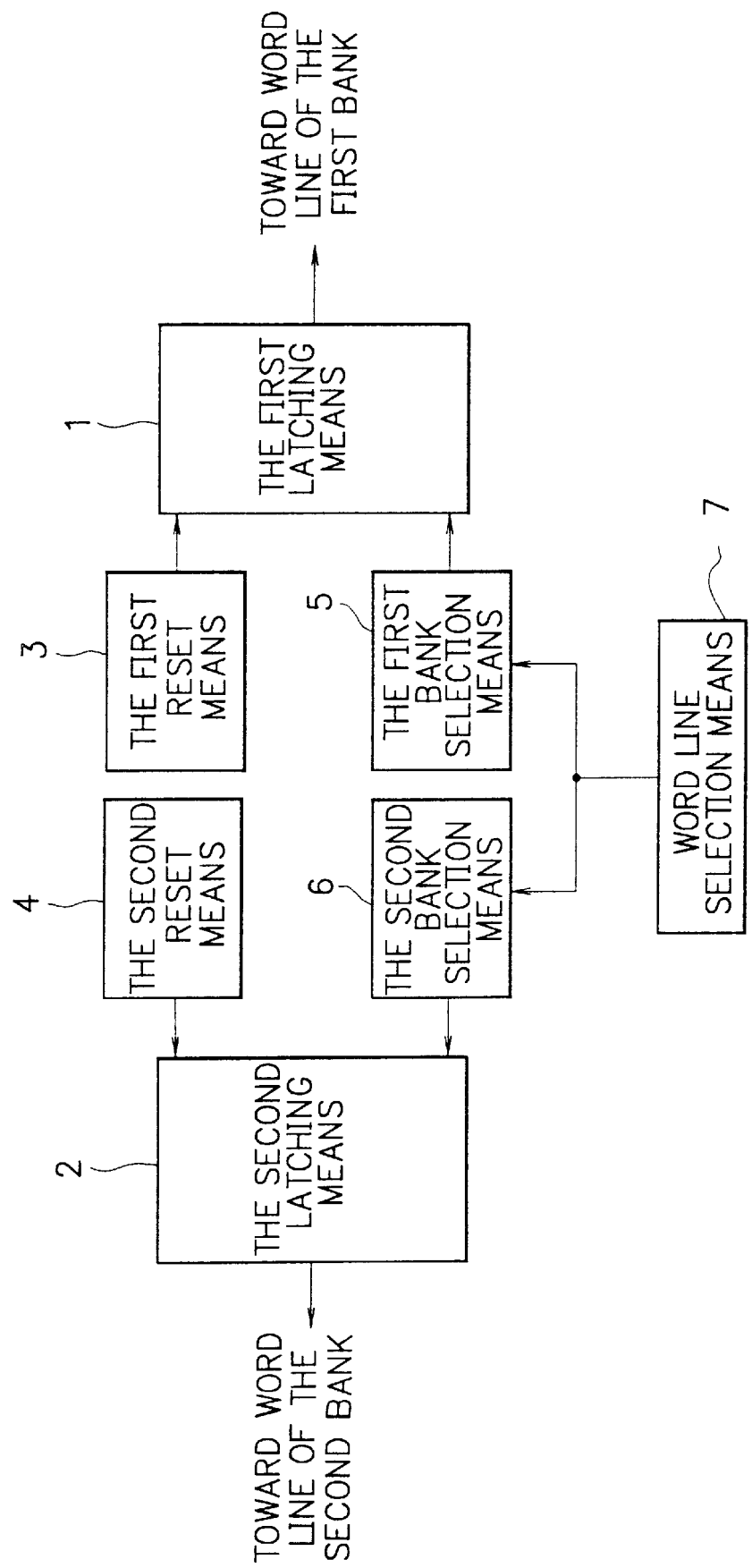
FIG. 4 is a block diagram showing a configuration of a decode circuit according to one embodiment of the present invention.

FIG. 4 is a block diagram showing a functional configuration of a decode circuit according to one embodiment of the present invention.

In FIG. 4, word line selection means 7 selects a word line of a semiconductor memory device having a first bank region and a second bank region. A first bank selection means 5 selects the first bank region of the semiconductor memory device. A second bank selection means 6 selects the second bank region of the semiconductor memory device. A first latching means 1 latches a word line selection signal outputted from the word line selection means 7 to maintain the word line of the first bank region in the condition of high level based on the selection signal outputted from the first bank selection means 5. A second latching means 2 latches the word line selection signal outputted from the word line selection means 7 to maintain the word line of the second bank region in the condition of high level based on the selection signal outputted from the second bank selection means 6. A first reset means 3 removes the latch of the word line selection signal by the first latch means 1 to make the word line of the first bank region low level. A second reset means 4 removes the latch of the word line selection signal by the second latch means 2 to make the word line of the second bank region low level.

Here, for example, a first latch means 1 and the second latch means 2 are constituted by the flip-flop.

For this reason, after it makes the word line of the first bank region high level by the word line selection signal, even if it permits the word line selection means 7 to cut away from the word line of the first bank region, the word line of the first bank region is capable of maintaining high level by the first latch means 1. For this reason, the word line selection means 7 becomes capable of being used for selecting the word line of the second bank region, since one word line selection means 7 can be used in common at the first bank region and the second bank region, area-increase of the decode circuit is capable of being restrained.

Figure 5:
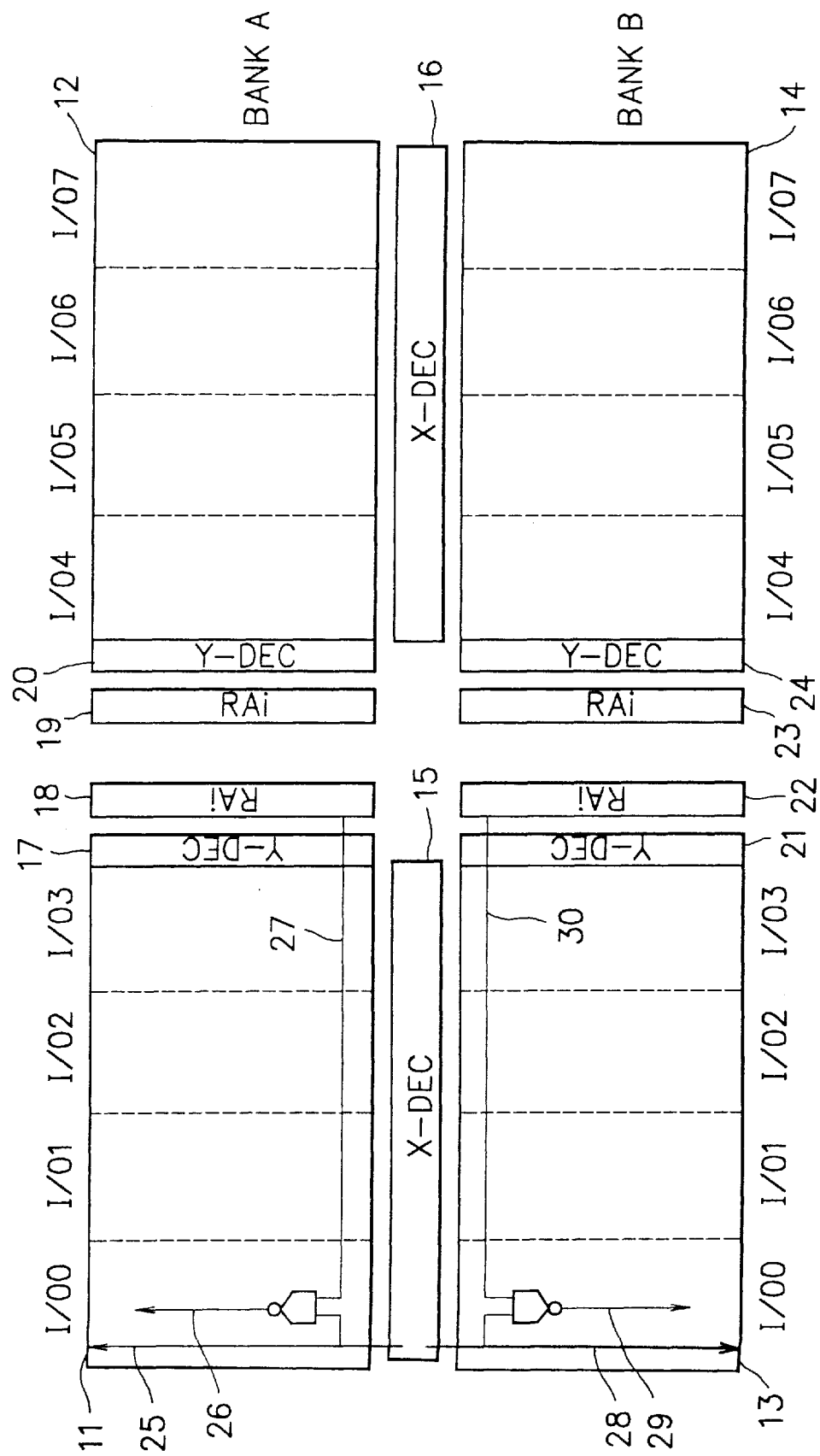
FIG. 5 is a block diagram showing an array configuration of a semiconductor memory device of sub-word method according to one embodiment of the present invention.

FIG. 5 is a block diagram showing an array configuration of a semiconductor memory device of a sub-word method according to the present invention.

In FIG. 5, reference numerals 11 to 14 denote memory cell arrays, reference numerals 15 and 16 denote X-decoders which select the main word lines 25 and 28, reference numerals 17, 20, 21, and 24 denote Y-decoders which select bit line, reference numerals 18, 19, 22, and 23 denote sub-decoders which select sub-word lines 26 end 29, reference numerals 25 and 28 denote main word line, reference numerals 26 and 29 denote sub-word lines, and reference numerals 27 and 30 denote sub-word selection line.

In the above constitution, the X-decoders 15 and 16 intervene between the upper memory cell arrays 11 and 12 and the lower memory cell arrays 13 and 14 by which the main word lines 25 and 28 are provided independently. The main word lines 25 and 28 provided independently are capable of being selected by the common X-decoders 15 and 16.

Figure 6:
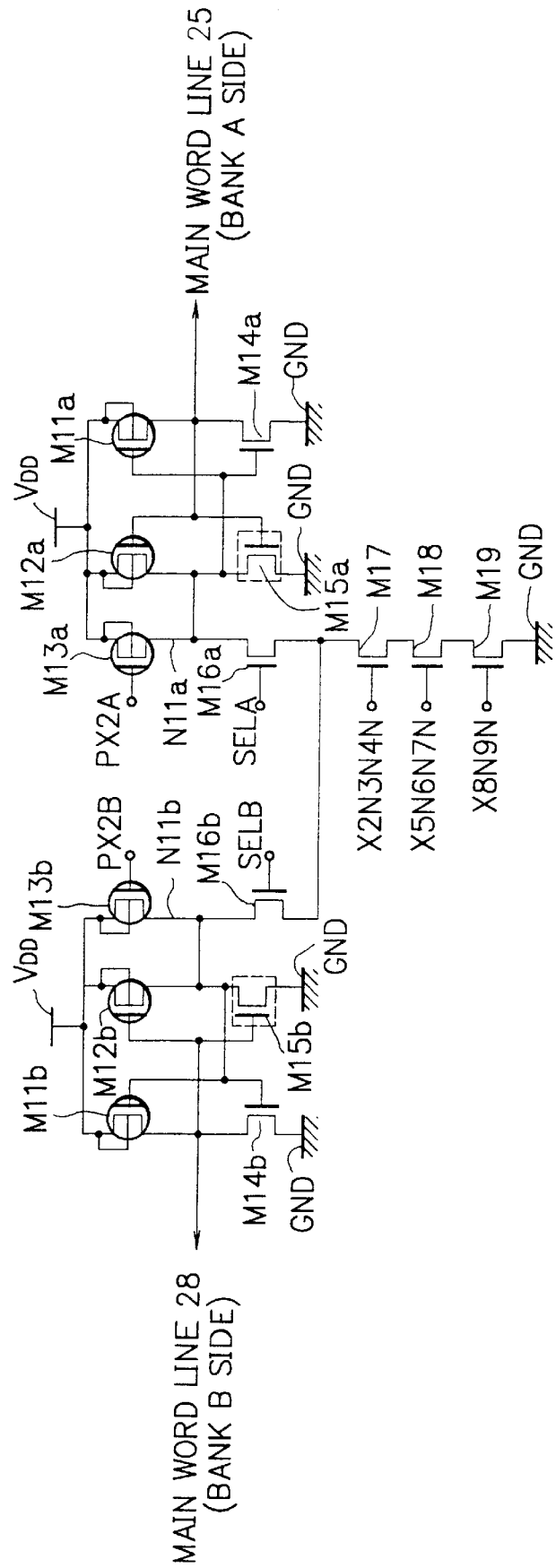
FIG. 6 is a circuit diagram showing a configuration of a decode circuit according to one embodiment of the present invention.

FIG. 6 is a circuit diagram showing a configuration of the X-decoders 15 and 16 of FIG. 5.

In FIG. 6, P channel MOS transistor M11a whose source is connected to a power source VDD, and whose drain is connected to the main word line 25 is provided.

P channel MOS transistor M12a whose source is connected to the power source VDD, whose gate is connected to the main word line 25, and whose drain is connected to the gate of the P channel MOS transistor M11a is provided.

P channel MOS transistor M13a whose source is connected to the power source VDD, whose gate is connected to an input terminal of a main word line reset signal PX2A, and whose drain is connected to the drain of the P channel MOS transistor M12a is provided.

N channel MOS transistor M14a whose source is connected to ground voltage GND, whose gate is connected to the gate of the P channel MOS transistor M11a, and whose drain is connected to the drain of the P channel MOS transistor M11a is provided.

N channel MOS transistor M15a whose source is connected to the ground voltage GND, whose gate is connected to the gate of the P channel MOS transistor M12a, and whose drain is connected to the drain of the P channel MOS transistor M12a is provided.

N channel MOS transistor M16a whose gate is connected to an input terminal of bank selection signal SELA, and whose drain is connected to the drain of the P channel MOS transistor M13a is provided.

Here, the P channel MOS transistors M11a, M12a and the N channel MOS transistors M14a, M15a constitute flip-flop respectively.

P channel MOS transistor M11b whose source is connected to the power source VDD, and whose drain is connected to the main word line 28 is provided.

P channel MOS transistor M12b whose source is connected to the power source VDD, whose gate is connected to the main word line 28, and whose drain is connected to the gate of the P channel MOS transistor M11b is provided.

P channel MOS transistor M13b whose source is connected to the power source VDD, whose gate is connected to an input terminal of main word line reset signal PX2B, and whose drain is connected to the drain of the P channel MOS transistor M12b is provided.

N channel MOS transistor M14b whose source is connected to the ground voltage GND, whose gate is connected to the gate of the P channel MOS transistor M11b, and whose drain is connected to the drain of the P channel MOS transistor M11b is provided.

N channel MOS transistor M15b whose source is connected to the ground voltage GND, whose gate is connected to the gate of the P channel MOS transistor M12b, and whose drain is connected to the drain of the P channel MOS transistor M12b is provided.

N channel MOS transistor M16b whose gate is connected to an input terminal of bank selection signal SELB, and whose drain is connected to the drain of the P channel MOS transistor M13b is provided.

Here, the P channel MOS transistors M11b, M12b and the N channel MOS transistors M14b, M15b constitute flip-flop respectively.

N channel MOS transistor M17 whose gate is connected to an input terminal of main word line selection signal X2N3N4N, and whose drain is connected to the source of the N channel MOS transistor M16a is provided.

N channel MOS transistor M18 whose gate is connected to an input terminal of main word line selection signal X5N6N7N, and whose drain is connected to the source of the N channel MOS transistor M17 is provided.

N channel MOS transistor M19 whose source is connected to the ground voltage GND, whose gate is connected to an input terminal of main word line selection signal X8N9N, and whose drain is connected to source of the N channel MOS transistor M18.

In the above constitution, when the main word line of the bank A is selected, the main word line selection signals X2N3N4N, X5N6N7N, and X8N9N, and the bank selection signal SELA become "H" level, while the bank selection signal SELB becomes "L" level. At this time, since the main word line reset signal PX2A becomes "H" level, the P channel MOS transistor M13a whose gate is connected to the input terminal of the main word line reset signal PX2A becomes non electrical continuity.

For this reason, the N channel MOS transistor M16a whose gate is connected to the input terminal of the bank selection signal SELA becomes electrical continuity. The N channel MOS transistor M17 whose gate is connected to the input terminal of the main word line selection signal X2N3N4N becomes electrical continuity. The N channel MOS transistor M18 whose gate is connected to the input terminal of the main word line selection signal X5N6N7N becomes electrical continuity. The N channel MOS transistor M19 whose gate is connected to the input terminal of the main word line selection signal X8N9N becomes electrical continuity. Contacts N11a which is connected to the drain of the N channel MOS transistor M16a becomes "L" level.

As a result, since the P channel MOS transistor M11a whose gate is connected to the contacts N11a becomes electrical continuity, while the N channel MOS transistor M14a whose gate is connected to the contacts N11a becomes non-electrical continuity, the main word line 25 becomes "H" level, thus selection of the main word line 25 is implemented.

When the main word line is selected, the main word line selection signals X2N3N4N, X5N6N7N, and X8N9N, and the bank selection signal SELA are maintained "H" level until the main word line 25 is selected, after the main word line 25 is selected, coming into "L" level. In this case, the main word line selection signals X2N3N4N, X5N6N7N, and X8N9N, and the bank selection signal SELA become "L" level. Voltage level of the main word line 25 thereafter is maintained by the flip-flop which is composed of the P channel MOS transistors M11a, M12a whose sources are connected to the power source VDD, and N channel MOS transistors M14a, M15a whose sources are connected to the ground voltage GND.

Next, when the main word line of the bank B is selected, the main word line selection signal X2N3N4N, X5N6N7N, and X8N9N, and the bank selection signal SELB become "H" level, while the bank selection signal SELA becomes "L" level. At this time, since the main word line reset signal PX2B is "H" level, the P channel MOS transistor M13b whose gate is connected to the input terminal of the main word line reset signal PX2B becomes non-electrical continuity.

For this reason, the N channel MOS transistor M16b whose gate is connected to the input terminal of the bank selection signal SELB becomes electrical continuity. The N channel MOS transistor M17 whose gate is connected to the input terminal of the main word line selection signal X2N3N4N becomes electrical continuity. The N channel MOS transistor M18 whose gate is connected to the input terminal of the main word line selection signal X5N6N7N becomes electrical continuity. The N channel MOS transistor M19 whose gate is connected to the input terminal of the main word line selection signal X8N9N becomes electrical continuity. Contacts N11b which is connected to the drain of the N channel MOS transistor M16b becomes "L" level.

As a result, since the P channel MOS transistor M11b whose gate is connected to the contacts N11b becomes electrical continuity, while the N channel MOS transistor M14b whose gate is connected to the contacts N11b becomes non-electrical continuity, the main word line 28 becomes "H" level, thus selection of the main word line 28 is implemented.

When the main word line is selected, the main word line selection signals X2N3N4N, X5N6N7N, and X8N9N, and the bank selection signal SELB are maintained "H" level until the main word line 28 is selected, after the main word line 28 is selected, coming into "L" level. In this case, the main word line selection signals X2N3N4N, X5N6N7N, and X8N9N, and the bank selection signal SELB become "L" level. Voltage level of the main word line 28 thereafter is maintained by the flip-flop which is composed of the P channel MOS transistors M11b, M12b whose sources are connected to the power source VDD, and N channel MOS transistors M14b, M15b whose sources are connected to the ground voltage GND.

Next, when the main word line of the bank A is not selected, the main word line selection signal X2N3N4N, X5N6N7N, and X8N9N, and the bank selection signal SELA become "L" level, while the main word line reset signal PX2A becomes "L" level. At this time, since the P channel MOS transistor M13a whose gate is connected to the input terminal of the main word line reset signal PX2A becomes electrical continuity.

For this reason, the N channel MOS transistor M16a whose gate is connected to the input terminal of the bank selection signal SELA becomes non-electrical continuity. The N channel MOS transistor M17 whose gate is connected to the input terminal of the main word line selection signal X2N3N4N becomes non-electrical continuity. The N channel MOS transistor M18 whose gate is connected to the input terminal of the main word line selection signal X5N6N7N becomes non-electrical continuity. The N channel MOS transistor M19 whose gate is connected to the input terminal of the main word line selection signal X8N9N becomes non-electrical continuity. Contacts N11a which is connected to the drain of the N channel MOS transistor M16a becomes "H" level.

As a result, since the P channel MOS transistor M11a whose gate is connected to the contacts N11a becomes non-electrical continuity, while the N channel MOS transistor M14a whose gate is connected to the contacts N11a becomes electrical continuity, the main word line 25 becomes "L" level, thus the main word line 25 becomes non selected state.

Next, when the main word line of the bank B is not selected, the main word line selection signal X2N3N4N, X5N6N7N, and X8N9N, and the bank selection signal SELB become "L" level, while the main word line reset signal PX2B becomes "L" level. At this time, the P channel MOS transistor M13b whose gate is connected to the input terminal of the main word line reset signal PX2B becomes electrical continuity.

For this reason, the N channel MOS transistor M16b whose gate is connected to the input terminal of the bank selection signal SELA becomes non-electrical continuity. The N channel MOS transistor M17 whose gate is connected to the input terminal of the main word line selection signal X2N3N4N becomes non-electrical continuity. The N channel MOS transistor M18 whose gate is connected to the input terminal of the main word line selection signal X5N6N7N becomes non-electrical continuity. The N channel MOS transistor M19 whose gate is connected to the input terminal of the main word line selection signal X8N9N becomes non-electrical continuity. Contacts N11b which is connected to the drain of the N channel MOS transistor M16b becomes "H" level.

As a result, since the P channel MOS transistor M11b whose gate is connected to the contacts N11b becomes non-electrical continuity, while the N channel MOS transistor M14b whose gate is connected to the contacts N11b becomes electrical continuity, the main word line 28 becomes "L" level, thus the main word line 28 becomes non selected state.

TABLE 1

|  | NON-LATCHING | LATCHING | PRIOR EXAM. |
|---|---|---|---|
| X-DECODE SELECTION SIGNAL |  |  |  |
| X2N3N4N–X2T3T4T | 8 × 2-BANKS | 8 | 8 |
| X5N6N7N–X5T6T7T | 8 × 2-BANKS | 8 | 8 |
| X8N9N–X8T9T | 4 × 2-BANKS | 4 | 4 |
| X-DECODER RESET SIGNAL PX2 | 1 × 2-BANKS | 1 × 2-BANKS | 1 |
| BANK SELECTION SIGNAL SELA (B) | NON | 1 × 2-BANKS | NON |
| TOTAL | 42 | 24 | 21 |

As shown in TABLE 1, the X-decoders 15 and 16 latch the main word lines 25 and 28 so that it is capable of reducing signal wiring for 18.

The voltage of the power source VDD of the X-decoders 15 and 16 may be applied from the outer side, or the voltage is boosted within the semiconductor memory device. In the embodiment described above, although the semiconductor memory device of sub-word method is explained, it would be preferred that the present invention is applied to the semiconductor memory device of word method in which the X-decoders 15 and 16 directly select the word line.

As described above, according to the present invention, there is provided latch means for the decode circuit which latch means latches the word line selection signal to maintain the word line at high level, after it causes the word line to reach high level, the word line is capable of being maintained at high level by the latch means, thus it is capable of reducing load of the word line selection means.

For this reason, when the decode circuit is provided between the first bank region and the second bank region which have common input / output section, selection of the word line of respective bank regions of the semiconductor memory device constituted by two banks is capable of being implemented by the common word line selection means. Thus an increase of the area of the decode circuit is capable of being inhibited and speed down caused by an increase of wiring length of input / output bus line is capable of being prevented.

While preferred embodiments of the invention have been described using specific terms, such description is for illustrative purpose only, and it is to be understood that changes and variations may be made without departing from the spirit or scope of the following claims.

What is claimed is:

1. A decode circuit comprising:
   word line selection means for selecting a word line changed into a high level and for releasing said word line when said word line has been latched;
   latching means for latching a word line selection signal outputted from said word line selection means, and for maintaining said word line at the high level; and
   reset means for resetting said word line from latch of said word line selection signal by said latching means, and for making said word line to be placed at a low level.

2. A decode circuit as claimed in claim 1, wherein said latching means provide a flip-flop therewith, said word line selection signal is supplied to a set terminal of said flip-flop, and a reset signal outputted from said reset means is supplied to a reset terminal of said flip-flop, and an output terminal of said flip-flop is connected to said word line.

3. A semiconductor memory device using a decode circuit as an X-decoder which decode circuit is described in claim 2.

4. A semiconductor memory device using a decode circuit as an X-decoder which decode circuit is described in claim 1.

5. In a decode circuit which is provided between a first bank region and a second bank region of a semiconductor memory device both of which banks have a common input/ output section, said decode circuit for use in said semiconductor memory device comprising:
   word line selection for selecting a word line changed into a high level and for releasing said word line when said word line has been latched;
   first bank selection means for selecting said first bank region;
   second bank selection means for selecting said second bank region;
   first latching means for latching a word line selection signal outputted from said word line selection means, and for maintaining said word line of said first bank region at the high level based on a selection signal outputted from said first bank selection means;
   second latching for latching a word line selection signal outputted from said word line selection means, and for maintaining a word line of said second bank region at the high level based on a selection signal outputted from said second bank selection means;

first reset means for resetting the latch of said word line selection signal by said first latching means, and for making said word line of said first bank region to be placed at a low level; and second reset means for releasing the latch of said word line selection signal by said second latching means, for making said word line of said second bank region to be place at the low level.

6. A decode circuit as claimed in claim 5, wherein said first latching means comprises a first flip-flop, and said second latching means comprises a second flip-flop, in said first flip-flop, a selection signal outputted from said first bank selection means is applied to a set terminal of said first flip-flop;

a reset signal outputted from said first reset means is applied to a reset terminal of said first flip-flop; and an output terminal of said first flip-flop is connected to said word line of said first bank region, in said second flip-flop, a selection signal outputted from said second bank selection means is applied to a set terminal of said second flip-flop;

a reset signal outputted from said second reset means is applied to a reset terminal of said second flip-flop; and an output terminal of said second flip-flop is connected to said word line of said second bank region.

7. A semiconductor memory device using a decode circuit as an X-decoder which decode circuit is described in claim 6.

8. A semiconductor memory device using a decode circuit as an X-decoder which decode circuit is described in claim 5.

* * * * *